(12) United States Patent
Camacho

(10) Patent No.: US 8,709,873 B2
(45) Date of Patent: *Apr. 29, 2014

(54) LEADLESS INTEGRATED CIRCUIT PACKAGING SYSTEM AND METHOD OF MANUFACTURE THEREOF

(75) Inventor: Zigmund Ramirez Camacho, Singapore (SG)

(73) Assignee: Stats ChipPac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/195,465

(22) Filed: Aug. 1, 2011

(65) Prior Publication Data

US 2011/0285001 A1 Nov. 24, 2011

Related U.S. Application Data

(63) Continuation of application No. 12/329,467, filed on Dec. 5, 2008, now Pat. No. 7,994,629.

(51) Int. Cl.
*H01L 21/00* (2006.01)

(52) U.S. Cl.
USPC ........... 438/111; 438/106; 257/690; 257/773; 257/775; 257/E23.061

(58) Field of Classification Search
USPC .......... 438/106, 111; 257/676, 690, 691, 697, 257/E23.02, E23.031, E23.045, E23.06, 257/E23.061
See application file for complete search history.

(56) References Cited

U.S. PATENT DOCUMENTS

| | | | |
|---|---|---|---|
| 6,001,671 A * | 12/1999 | Fjelstad | 438/112 |
| 6,476,506 B1 | 11/2002 | O'Connor et al. | |
| 6,559,526 B2 | 5/2003 | Lee et al. | |
| 6,573,121 B2 | 6/2003 | Yoneda et al. | |
| 7,102,216 B1 | 9/2006 | Foster | |
| 7,251,872 B2 | 8/2007 | Awad et al. | |
| 7,271,032 B1 * | 9/2007 | McLellan et al. | 438/111 |
| 7,279,780 B2 | 10/2007 | Fee et al. | |
| 2005/0062172 A1 * | 3/2005 | Low et al. | 257/787 |
| 2007/0007665 A1 * | 1/2007 | Clevenger et al. | 257/780 |
| 2007/0210422 A1 * | 9/2007 | Chow et al. | 257/666 |

FOREIGN PATENT DOCUMENTS

KR 1020070078593 * 8/2007 ............ H01L 23/495

* cited by examiner

*Primary Examiner* — Matthew Reames
*Assistant Examiner* — Farid Khan
(74) *Attorney, Agent, or Firm* — Ishimaru & Associates LLP

(57) ABSTRACT

A method of manufacture of a leadless integrated circuit packaging system includes: providing a substrate; patterning a die attach pad on the substrate; forming a tiered plated pad array around the die attach pad; mounting an integrated circuit die on the die attach pad; coupling an electrical interconnect between the integrated circuit die and the tiered plated pad array; forming a molded package body on the integrated circuit die, the electrical interconnects, and the tiered plated pad array; and exposing a contact pad layer by removing the substrate.

20 Claims, 6 Drawing Sheets

LEADLESS INTEGRATED CIRCUIT PACKAGING SYSTEM AND METHOD OF MANUFACTURE THEREOF

CROSS-REFERENCE TO RELATED APPLICATION(S)

This is a continuation of U.S. patent application Ser. No. 12/329,467 filed Dec. 5, 2008 now U.S. Pat. No. 7,994,629.

TECHNICAL FIELD

The present invention relates generally to an integrated circuit packaging system, and more particularly to a system for packaging high pin count integrated circuits in no-lead style packages.

BACKGROUND ART

Many of today's consumer electronic devices incorporate a significant number of integrated circuits in a very limited space. Significant pressure has been put on the integrated circuit packaging industry to incorporate the semiconductor die in exceedingly smaller packages. This industry pressure has led to the development of the conventional quad flat packages (QFP). QFP's are formed with a semiconductor die connected to a lead frame and being encapsulated to form a package such that a plurality of leads extends laterally outwardly from each side of the periphery of the encapsulating structure.

Such a configuration is relatively simple in design and may be efficiently produced. However, the QFP-type semiconductor has shown various design and production limitations. For example, reducing the overall package size of a QFP becomes difficult because of the arrangement of leads about the lateral periphery of the package. This is particularly evident when reduced package size is attempted to be combined with increasing the number of input/output (I/O) connections required for the smaller yet ever-more complex dice representing the state of the art.

In order to increase the number of I/O connections while decreasing the package size a higher density of connections would be required along the package perimeter. However, such an increased density of leads about the package perimeter inherently requires a reduced pitch or spacing between adjacent leads and promotes an increased likelihood of crosstalk and signal interference as well as making such packages more difficult assemble in a high volume product.

In an effort to increase the number of connections in an integrated circuit (IC) package while decreasing the overall size, alternative packaging arrangements have been implemented. For example, grid array devices such as pin grid arrays (PGA), ball grid arrays (BGA), land grid arrays (LGA) and their associated variants have been used to reduce package size and increase input/output connections.

As an example of a grid array type device, a BGA device employs a number of input/output connections in the form of conductive bumps, such as solder balls, extending transversely from a major surface of the package in a pattern, or "array," of columns and rows. The conductive bumps may be formed on one surface of a circuit board or other interposer substrate and are in electrical connection with bonding pads on the opposing surface of the circuit board. A semiconductor die is coupled to the bonding pads, such as by wire bonding, to establish electrical connections from the bond pads of the semiconductor die to the conductive bumps. The resulting assembly is then typically encapsulated such as by transfer molding with a filled polymer with the array of conductive bumps being left exposed for subsequent electrical connection to higher level packaging such as a carrier substrate.

The conductive bumps are configured to be coupled to a mirror image pattern of terminal pads on the carrier substrate which may comprise a printed circuit board (PCB) or another structure by reflowing the solder. In essence, a BGA device increases the number of input/output connections by allowing the connections to be positioned over substantially the entirety of a major surface of the package rather than extending laterally outwardly from the periphery of the package such as in a QFP.

While BGA and other grid array devices provide an increased number of input/output connections and may allow a simultaneous reduction in size for a given package, such devices are not without their own limitations and drawbacks. For example, the use of circuit board interposers, upon which the array of conductive elements is formed, imposes limitations on the size of the package since the circuit board is typically larger than the semiconductor die. Additionally, the circuit boards used in making BGA packages have been known to take on moisture during the fabrication process, leading to subsequent cracking and warping which cause early life failures of the device. Furthermore, the cost of circuit boards used in the fabrication of grid array type devices may also be viewed as a drawback.

Thus, a need still remains for leadless integrated circuit packaging system, which can resolve the manufacturing issues of the grid array devices while enabling the increased growth of input/output connections and shrinking size of the package outline. In view of the industry demand for higher levels of integration in smaller spaces, it is increasingly critical that answers be found to these problems. Also in view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a leadless integrated circuit packaging system including: providing a substrate; patterning a die attach pad on the substrate; forming a tiered plated pad array around the die attach pad; mounting an integrated circuit die on the die attach pad; coupling an electrical interconnect between the integrated circuit die and the tiered plated pad array; forming a molded package body on the integrated circuit die, the electrical interconnects, and the tiered plated pad array; and exposing a contact pad layer by removing the substrate.

The present invention provides a leadless integrated circuit packaging system including: a die attach pad; a tiered plated pad array around the die attach pad; an integrated circuit die mounted on the die attach pad; an electrical interconnect coupled to the tiered plated pad array and the integrated circuit die; a molded package body on the integrated circuit die, the electrical interconnects, and the tiered plated pad array; and a contact pad layer on a package bottom of the molded package body.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
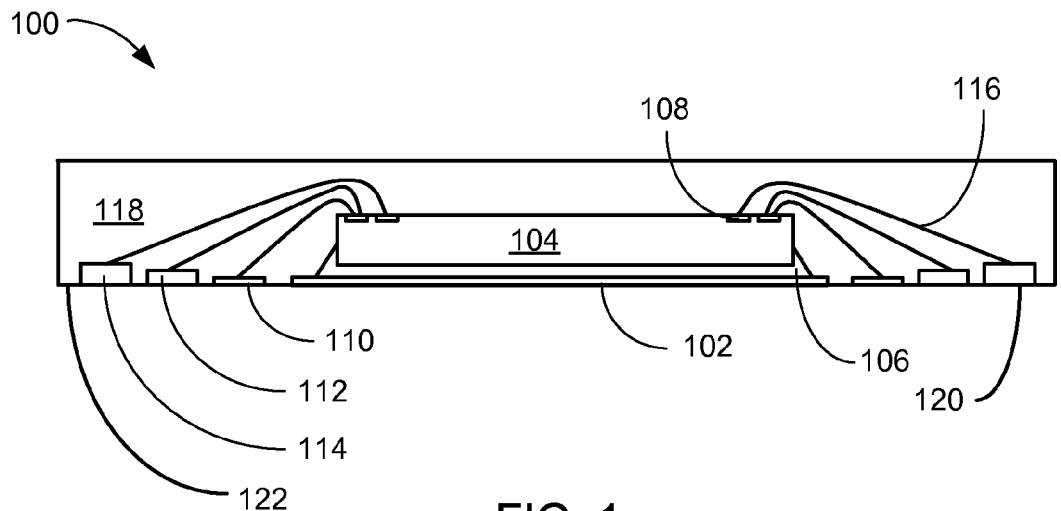
FIG. 1 is a cross-sectional view of a leadless integrated circuit packaging system taken across line 1-1 of FIG. 2 in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements. The term "processing" as used herein includes stamping, forging, patterning, exposure, development, etching, cleaning, and/or removal of the material or laser trimming as required in forming a described structure.

Figure 2:
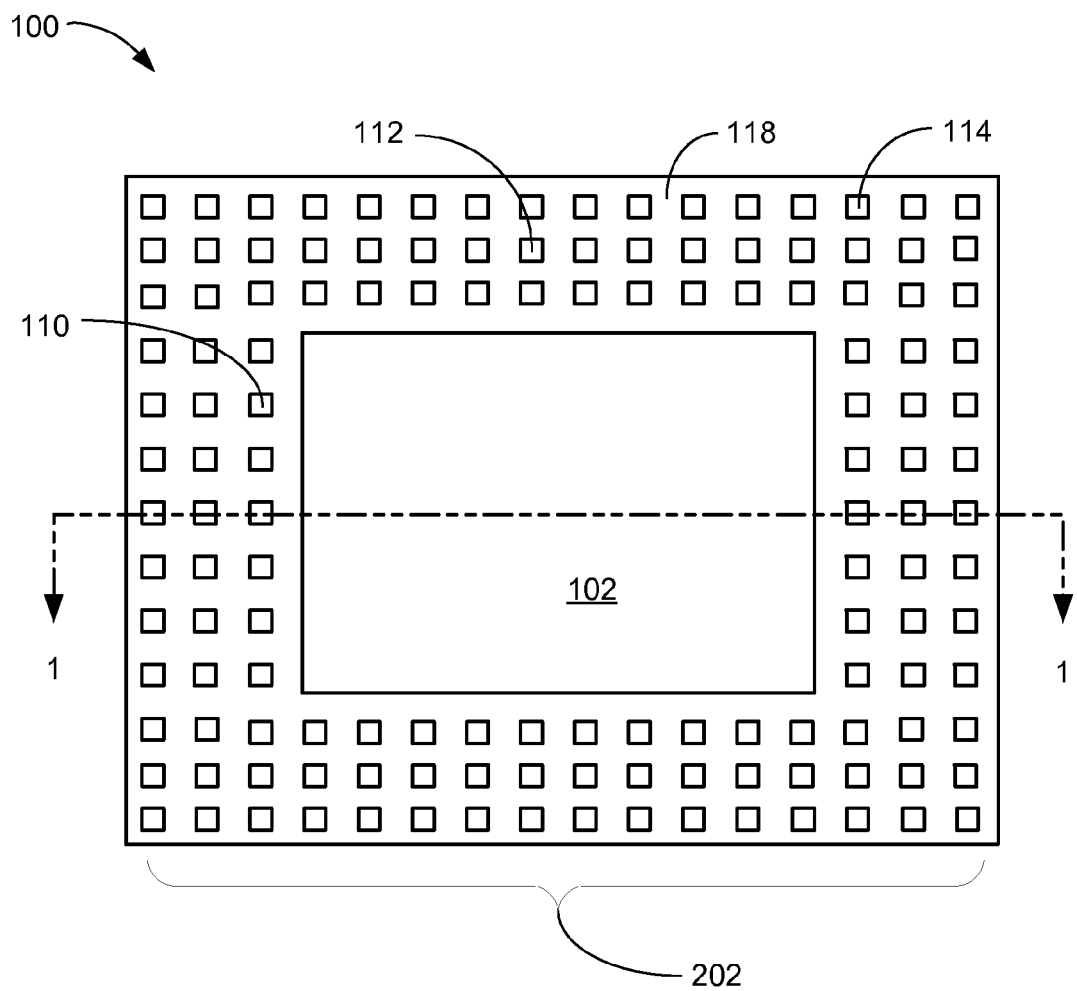
FIG. 2 is a bottom view of the leadless integrated circuit packaging system of FIG. 1.

Referring now to FIG. 1, therein is shown a cross-sectional view of a leadless integrated circuit packaging system 100 taken across line 1-1 of FIG. 2 in an embodiment of the present invention. The cross-sectional view of the leadless integrated circuit packaging system 100 depicts a die attach pad 102 having an integrated circuit die 104 mounted by an adhesive 106. The integrated circuit die 104 may have multiple rows of bond pads 108 for coupling a one tier plated pad 110, a two tier plated pad 112, a three tier plated pad 114, or a combination thereof by electrical interconnects 116, such as bond wires. A molded package body 118, such as an epoxy molding compound, may be formed on the die attach pad 102, the integrated circuit die 104, the one tier plated pad 110, the two tier plated pad 112, the three tier plated pad 114, and the electrical interconnects 116.

It has been discovered that by positioning the one tier plated pad 110, the two tier plated pad 112, and the three tier plated pad 114 around the integrated circuit die 104 shorter lengths of the electrical interconnects 116 may be used. There may also be a wider separation distance between the electrical interconnects that may reduce the incidence of shorted pads after forming the molded package body 118.

The one tier plated pad 110, the two tier plated pad 112, and the three tier plated pad 114 are an example only. A design may be implemented with only the one tier plated pad 110 and the two tier plated pad 112, or there may be additional levels of the plated pads. The position and elevation change on the one tier plated pad 110, the two tier plated pad 112, and the three tier plated pad 114 is an example only and may differ. The number and position of the bond pads 108 may differ in an actual implementation. The ability to maintain a minimum separation distance between the electrical interconnects 116 is important, for a high volume manufacturing flow, to prevent creating a defective component due to shorts between the electrical interconnects 116. A package contact 120 may be present at the exposed base of each of the one tier plated pad 110, the two tier plated pad 112, and the three tier plated pad 114. The package contact 120 may be available for connection on a package bottom 122 of the molded package body 118.

Referring now to FIG. 2, therein is shown a bottom view of the leadless integrated circuit packaging system 100, of FIG.

1. The bottom view of the leadless integrated circuit packaging system 100 depicts the section line 1-1 that shows the position and direction of view of FIG. 1. The die attach pad 102 may be centrally located within the molded package body 118. A tiered plated pad array 202 includes the one tier plated pad 110, the two tier plated pad 112, and the three tier plated pad 114 and may be formed around the die attach pad 102. The one tier plated pad 110 may be positioned closest to the die attach pad 102 and may be flanked by the two tier plated pad 112 spaced farther from the die attach pad 102. The three tier plated pad 114 may be positioned still farther from the die attach pad 102. Along lateral direction away from the die attach pad 102, the one tier plated pad 110, the two tier plated pad 112. and the three tier plated pad 114, all adjacent to the die peripheral side 204, have different heights. In this fashion, the tallest of the plated pads will be positioned farthest from the die attach pad 102.

The number and position of the one tier plated pad 110, the two tier plated pad 112, and the three tier plated pad 114 in the tiered plated pad array 202 is an example only and the actual implementation may differ. The shape of the one tier plated pad 110, the two tier plated pad 112, and the three tier plated pad 114 is also an example and any other geometric shape is possible.

Figure 3:
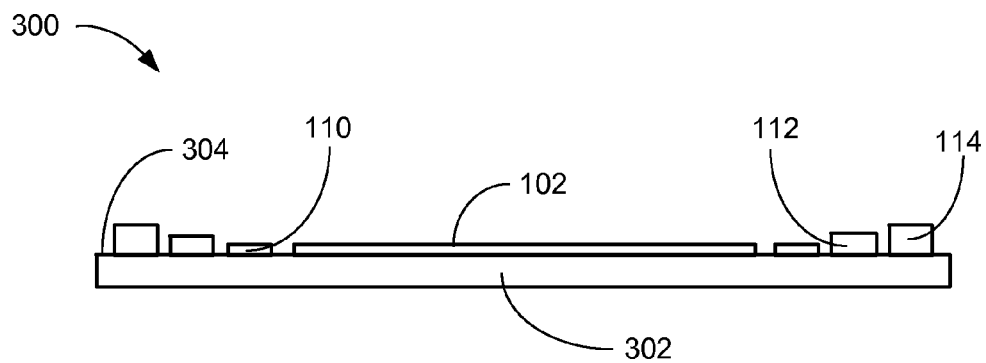
FIG. 3 is a cross-sectional view, substantially similar to FIG. 1, of a leadless integrated circuit packaging system in a base assembly phase of manufacturing.

Referring now to FIG. 3, therein is shown a cross-sectional view, substantially similar to FIG. 1, of a leadless integrated circuit packaging system 300 in a base assembly phase of manufacturing. The cross-sectional view of the leadless integrated circuit packaging system 300 depicts a substrate 302, such as a copper substrate, having a planar surface 304 may have the die attach pad 102, the one tier plated pad 110, the two tier plated pad 112, and the three tier plated pad 114 plated thereon.

While the substrate 302 is shown having a single pattern for the leadless integrated circuit packaging system 300, this is an example only and the substrate 302 may support a matrix of such pattern groups. By assembling the die attach pad 102, the one tier plated pad 110, the two tier plated pad 112, and the three tier plated pad 114 on the planar surface 304, it is assured that the resulting package will have planar contacts.

Figure 4:
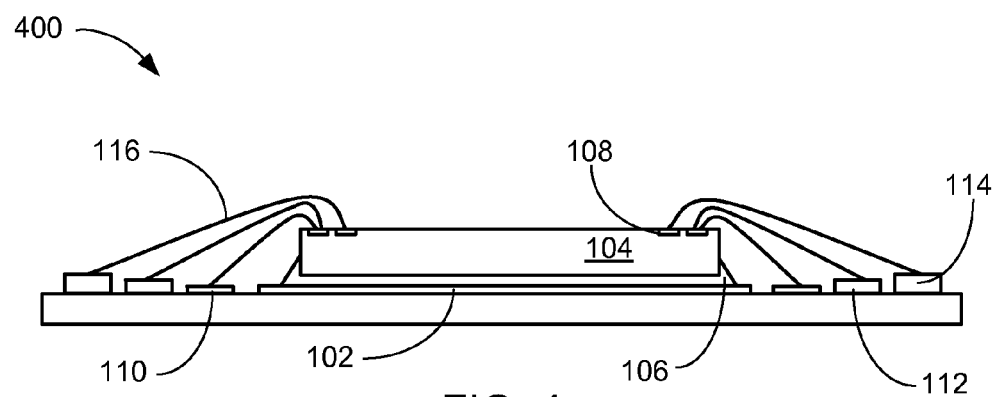
FIG. 4 is a cross-sectional view, substantially similar to FIG. 1, of a leadless integrated circuit packaging system in an integrated circuit coupling phase of manufacturing.

Referring now to FIG. 4, therein is shown a cross-sectional view, substantially similar to FIG. 1, of a leadless integrated circuit packaging system 400 in an integrated circuit coupling phase of manufacturing. The cross-sectional view of the leadless integrated circuit packaging system 400 depicts the integrated circuit die 104 attached to the die attach pad 102 by the adhesive 106. The electrical interconnects 116 may couple the bond pads 108 to the one tier plated pad 110, the two tier plated pad 112, the three tier plated pad 114, or the combination thereof.

The coupling pattern of the electrical interconnects 116 is an example only and other coupling patterns are possible. While the elevation level of the one tier plated pad 110, the two tier plated pad 112, and the three tier plated pad 114 is an example only, it can be seen that a less sharp bend may be used to couple the three tier plated pad 114 to the bond pad 108. This may allow for a shorter overall package height. Since the industry demand for smaller packaging includes the package thickness, this aspect of the invention may help satisfy the industry demand.

Figure 5:
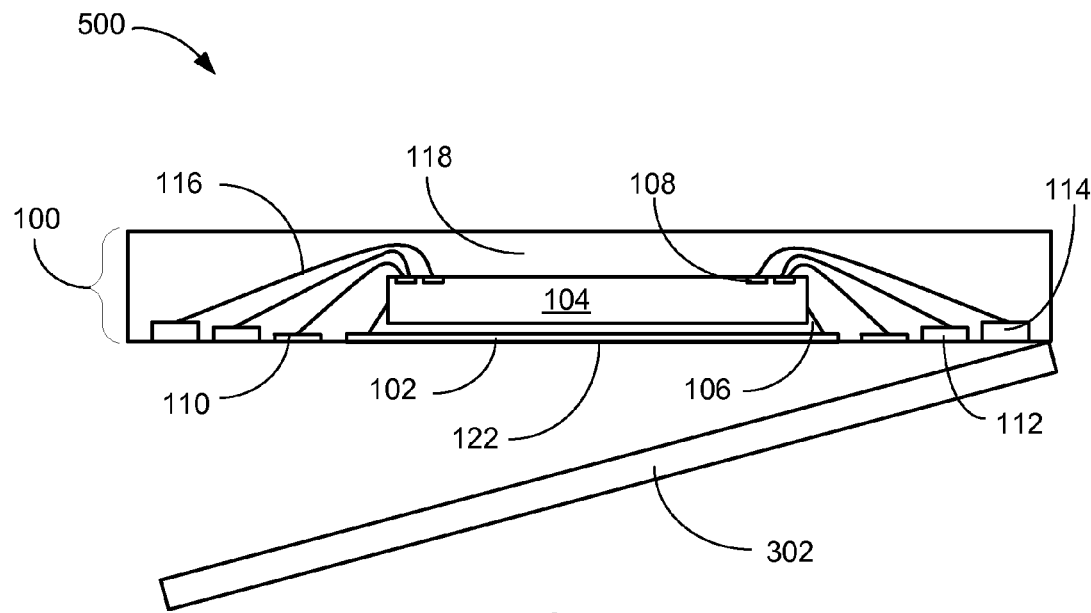
FIG. 5 is a cross-sectional view, substantially similar to FIG. 1, of a leadless integrated circuit packaging system in a molding phase of manufacturing.

Referring now to FIG. 5, therein is shown a cross-sectional view, substantially similar to FIG. 1, of a leadless integrated circuit packaging system 500 in a molding phase of manufacturing. The cross-sectional view of the leadless integrated circuit packaging system 500 depicts the molded package body 118 formed on the on the die attach pad 102, the integrated circuit die 104, the one tier plated pad 110, the two tier plated pad 112, the three tier plated pad 114, and the electrical interconnects 116. Once the molded package body 118 has been formed, the substrate 302 may be removed leaving the leadless integrated circuit packaging system 100 free for further processing. By removing the substrate 302, the package bottom 122 of the leadless integrated circuit packaging system 100 may be exposed. The tiered plated pad array 202, of FIG. 2, and the die attach pad 102 may be held in place by the molded package body 118.

Figure 6:
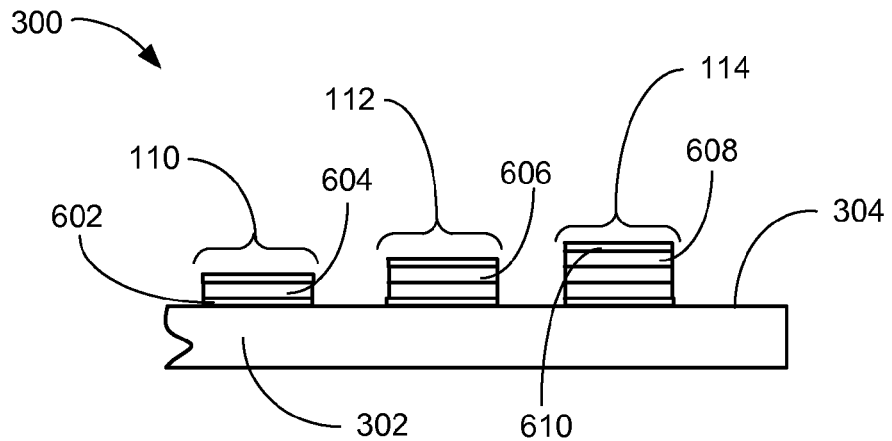
FIG. 6 is a cross-sectional view, substantially similar to FIG. 1, of an enlarged section of the leadless integrated circuit packaging system of FIG. 3.

Referring now to FIG. 6, therein is shown a cross-sectional view, substantially similar to FIG. 1, of an enlarged section of the leadless integrated circuit packaging system 300 of FIG. 3. The cross-sectional view of the enlarged section of the leadless integrated circuit packaging system 300 depicts the substrate 302 having a contact pad layer 602 plated on the planar surface 304. The material used to form the contact pad layer 602 may be Lead (Pb) or Gold (Au), as these materials do not form a solid bond when plated on the planar surface 304 of Copper (Cu).

A first tier layer 604 may be plated over the contact pad layer 602 as shown in the one tier plated pad 110, the two tier plated pad 112, and the three tier plated pad 114. The first tier layer 604 may be formed by plating a spacer metal, such as Nickel (Ni) on the contact pad layer 602. A second tier layer 606 may be plated on the first tier layer 604, but only in the two tier plated pad 112 and the three tier plated pad 114. The second tier layer 606 may also be formed of the spacer metal, such as Nickel or some other compatible metal. A third tier layer 608 may be formed on the second tier layer 606, but only in the three tier plated pad 114. A connection cap layer 610, such as a Silver (Ag) layer may be formed on the upper most spacer metal of the one tier plated pad 110, the two tier plated pad 112, and the three tier plated pad 114. The plated pads along a lateral direction away from the die attach pad have additional layers of the spacer metal for different heights. For example, the two tier plated pad 112 has two layers; the first tier layer 604 and the second tier layer 606 and is higher than the one tier plated pad 110 which has the first tier layer 604. The three tier plated pad 114 has three layers; the first tier layer 604, the second tier layer 606, and the third tier layer 608, and is higher than the two tier plated pad 112.

Figure 7:
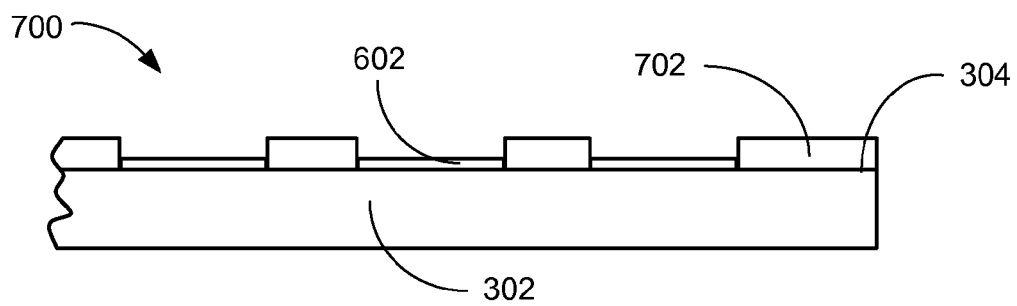
FIG. 7 is a cross-sectional view, substantially similar to FIG. 1, of the enlarged section of a leadless integrated circuit packaging assembly in a first plating phase of manufacture.

Referring now to FIG. 7, therein is shown a cross-sectional view, substantially similar to FIG. 1, of the enlarged section of a leadless integrated circuit packaging assembly 700 in a first plating phase of manufacture. The cross-sectional view of the enlarged section of the leadless integrated circuit packaging assembly 700 depicts the substrate 302 having the planar surface 304. A first mask layer 702 may be patterned on the planar surface 304. The contact pad layer 602 may be plated in the space not covered by the first mask layer 702.

Figure 8:
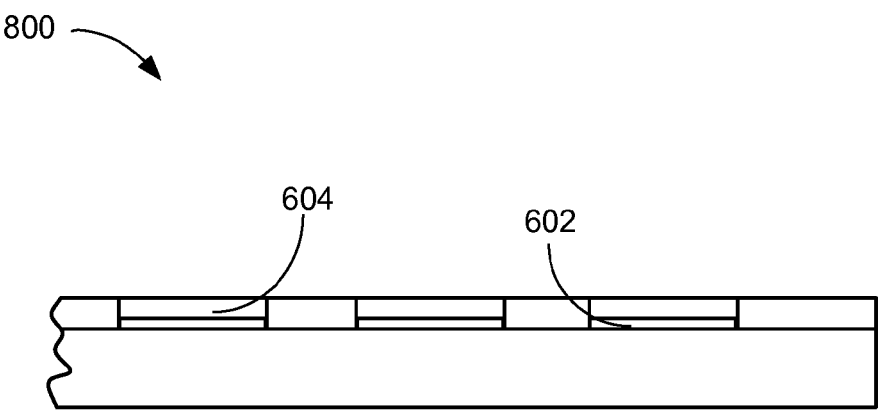
FIG. 8 is a cross-sectional view, substantially similar to FIG. 1, of the enlarged section of a leadless integrated circuit packaging assembly in a second plating phase of manufacture.

Referring now to FIG. 8, therein is shown a cross-sectional view, substantially similar to FIG. 1, of the enlarged section of a leadless integrated circuit packaging assembly 800 in a second plating phase of manufacture. The cross-sectional view of the enlarged section of the leadless integrated circuit packaging assembly 800 depicts the first tier layer 604 plated on the contact pad layer 602.

Figure 9:
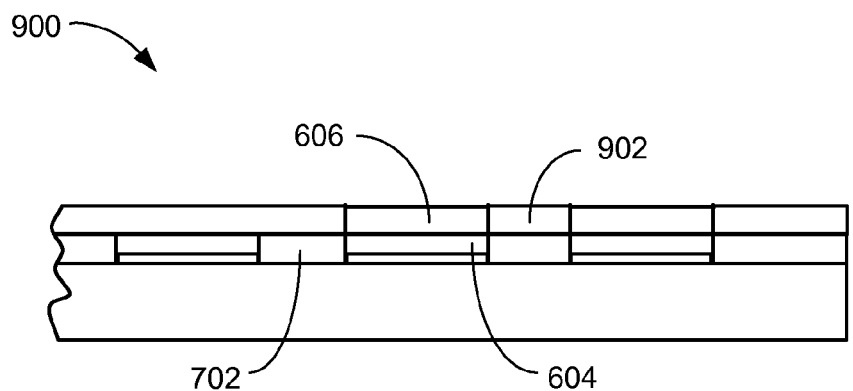
FIG. 9 is a cross-sectional view, substantially similar to FIG. 1, of the enlarged section of a leadless integrated circuit packaging assembly in a third plating phase of manufacture.

Referring now to FIG. 9, therein is shown a cross-sectional view, substantially similar to FIG. 1, of the enlarged section of a leadless integrated circuit packaging assembly 900 in a third plating phase of manufacture. The cross-sectional view of the enlarged section of the leadless integrated circuit packaging assembly 900 depicts a second mask layer 902 on the first mask layer 702. The second mask layer 902 may also cover the first tier layer 604. The second tier layer 606 may be plated on the first tier layer 604.

While the first tier layer 604 and the second tier layer 606 are shown as separate layers, they may be a continuation of the plating of the first material. Of significance is the fact that an additional thickness of material represented by the second tier layer 606 is added in the spaces not covered by the second mask layer 902.

Figure 10:
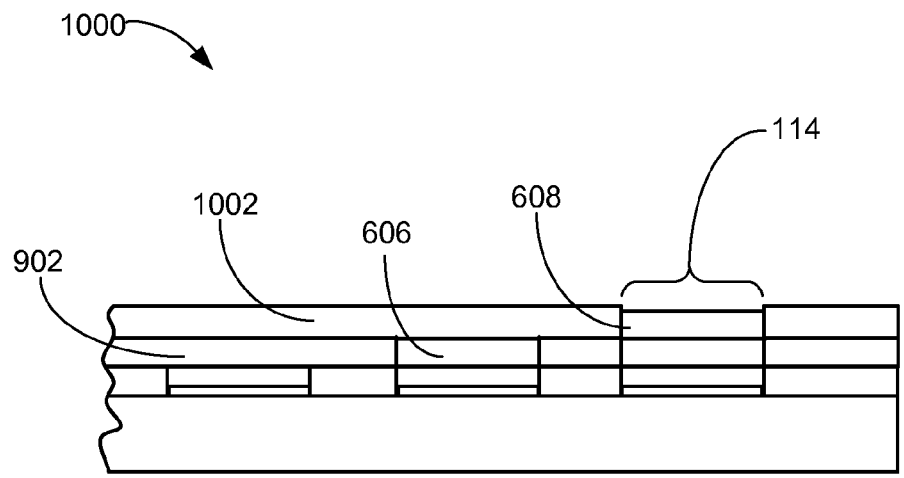
FIG. 10 is a cross-sectional view, substantially similar to FIG. 1, of the enlarged section of a leadless integrated circuit packaging assembly in a fourth plating phase of manufacture.

Referring now to FIG. 10, therein is shown a cross-sectional view, substantially similar to FIG. 1, of the enlarged section of a leadless integrated circuit packaging assembly 1000 in a fourth plating phase of manufacture. The cross-sectional view of the enlarged section of the leadless integrated circuit packaging assembly 1000 depicts a third mask layer 1002 formed on the second mask layer 902. The third mask layer 1002 may also cover the second tier layer 606. The addition of the third tier layer 608 on the exposed areas of the second tier layer 606 allows the additional thickness to grow the three tier plated pad 114.

Figure 11:
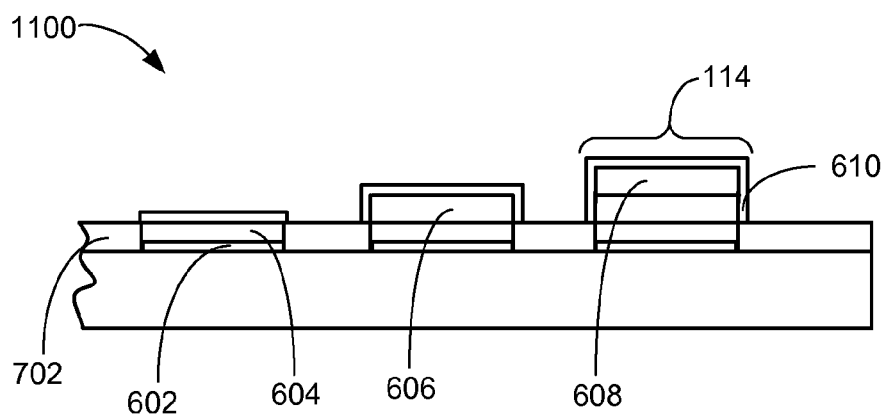
FIG. 11 is a cross-sectional view, substantially similar to FIG. 1, of the enlarged section of a leadless integrated circuit packaging assembly in a cap forming phase of manufacture.

Referring now to FIG. 11, therein is shown a cross-sectional view, substantially similar to FIG. 1, of the enlarged section of a leadless integrated circuit packaging assembly 1100 in a cap forming phase of manufacture. The cross-sectional view of the enlarged section of the leadless integrated circuit packaging assembly 1100 depicts the connection cap layer 610 formed on the exposed areas of the first tier layer 604, the second tier layer 606, the third tier layer 608, or a combination thereof. The presence of the first mask layer 702 prevents the connection cap layer 610 from contacting the contact pad layer 602.

The materials chosen for the forming of the three tier plated pad 114 provide the best possible combination for forming reliable connections in the respective sides. The connection cap layer 610 may be coupled to the electrical interconnects 116, of FIG. 1. In most applications the material used for the electrical interconnects is aluminum (Al) or Gold (Au), which may form a compatible connection with Silver (Ag). The contact pad layer 602 may be coupled to a printed circuit board (not shown) which in most applications has Gold coated contacts.

Figure 12:
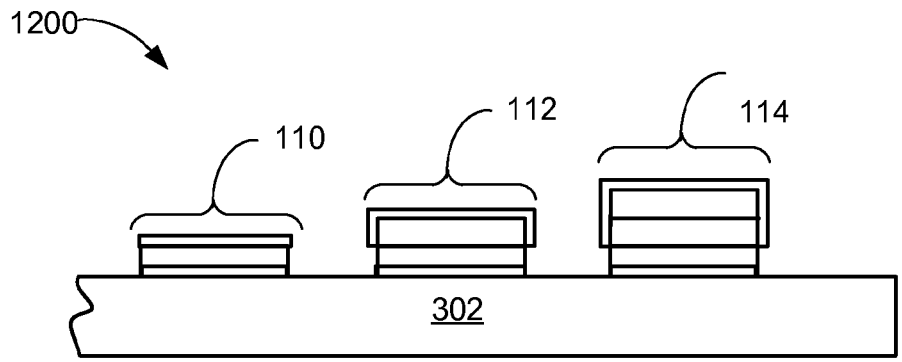
FIG. 12 is a cross-sectional view, substantially similar to FIG. 1, of the enlarged section of a leadless integrated circuit packaging assembly in a mask removal phase of manufacture.

Referring now to FIG. 12, therein is shown a cross-sectional view, substantially similar to FIG. 1, of the enlarged section of a leadless integrated circuit packaging assembly 1200 in a mask removal phase of manufacture. The cross-sectional view of the enlarged section of the leadless integrated circuit packaging assembly 1200 depicts the substrate 302 having the one tier plated pad 110, the two tier plated pad 112, and the three tier plated pad 114 formed thereon.

Figure 13:
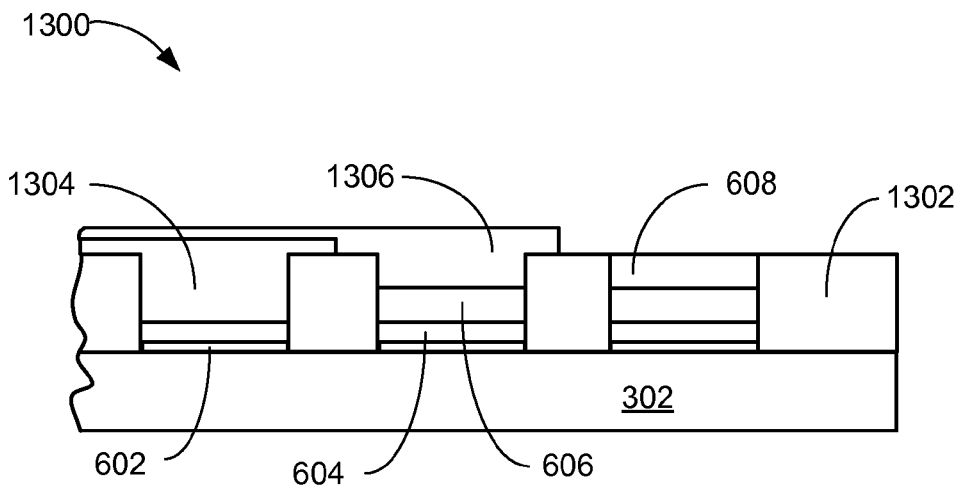
FIG. 13 is a cross-sectional view, substantially similar to FIG. 1, of the enlarged section of a leadless integrated circuit packaging assembly in an alternative embodiment of the fourth plating phase of manufacture.

Referring now to FIG. 13, therein is shown a cross-sectional view, substantially similar to FIG. 1, of the enlarged section of a leadless integrated circuit packaging assembly 1300 in an alternative embodiment of the fourth plating phase of manufacture. The cross-sectional view of the enlarged section of the leadless integrated circuit packaging assembly 1300 depicts a first mask 1302 patterned on the substrate 302. The first mask 1302 may provide a very deep opening in which is plated the contact pad layer 602, the first tier layer 604, the second tier layer 606, and the third tier layer 608.

After the contact pad layer 602 and the first tier layer 604 are plated in all of the openings, a second mask 1304 may be applied over some of the openings that do not get additional layers, such as the second tier layer 606. After the second tier layer 606 has been applied a third mask 1306 may be applied to the openings that do not get additional layers, such as the third tier layer 608. When the third tier layer 608 has been applied, the second mask 1304 and the third mask 1306 may be removed by selective etching.

Figure 14:
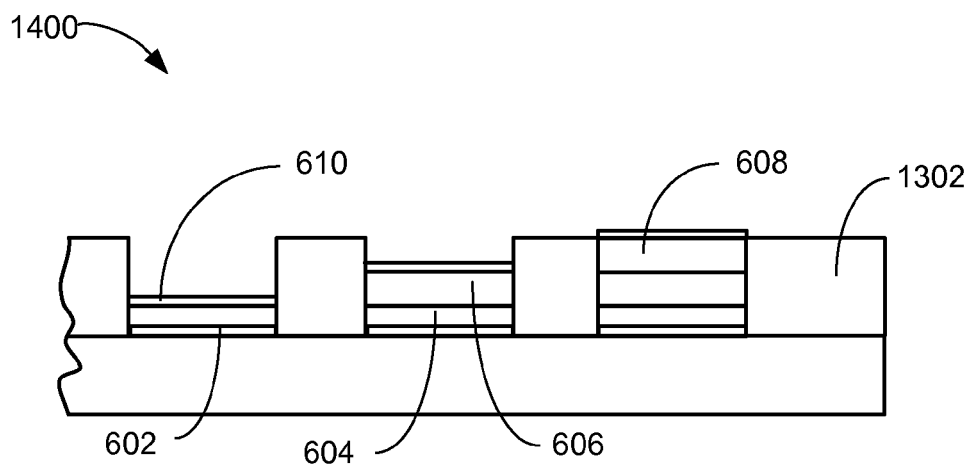
FIG. 14 is a cross-sectional view, substantially similar to FIG. 1, of the enlarged section of a leadless integrated circuit packaging assembly in an alternative embodiment of the cap forming phase of manufacture.

Referring now to FIG. 14, therein is shown a cross-sectional view, substantially similar to FIG. 1, of the enlarged section of a leadless integrated circuit packaging assembly 1400 in an alternative embodiment of the cap forming phase of manufacture. The cross-sectional view of the enlarged section of the leadless integrated circuit packaging assembly 1400 depicts the connection cap layer 610 formed on the exposed areas of the first tier layer 604, the second tier layer 606, and the third tier layer 608. Since the first mask 1302 covers the sidewalls of the stacks, only the exposed surface of the first tier layer 604, the second tier layer 606, or the third tier layer 608 may be plated by the connection cap 610. After the plating of the connection cap 610, the first mask 1302 may be etched away exposing the structure of FIG. 6.

Figure 15:
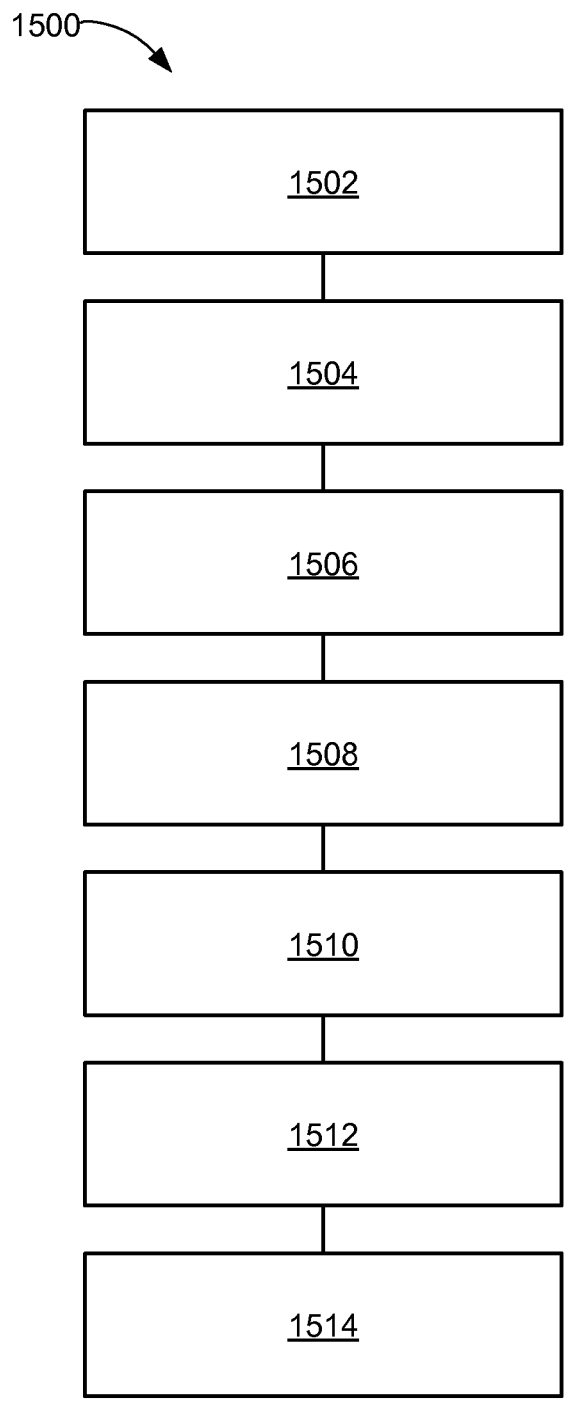
FIG. 15 is a flow chart of a method of manufacture of a leadless integrated circuit packaging system in a further embodiment of the present invention.

Referring now to FIG. 15, therein is shown a flow chart of a method 1500 of manufacture of a leadless integrated circuit packaging system in a further embodiment of the present invention. The method 1500 includes providing a substrate in a block 1502; patterning a die attach pad on the substrate in a block 1504; forming a tiered plated pad array around the die attach pad in a block 1506; mounting an integrated circuit die on the die attach pad in a block 1508; coupling an electrical interconnect between the integrated circuit die and the tiered plated pad array in a block 1510; forming a molded package body on the integrated circuit die, the electrical interconnects, and the tiered plated pad array in a block 1512; and exposing a contact pad layer by removing the substrate in a block 1514.

It has been discovered that the present invention thus has numerous aspects.

An aspect that has been unexpectedly discovered is that the present invention may provide less warping during assembly and operation than a ball grid array package, because the tiered plated pad array does not have a lead frame to put pressure on the individual contact pads.

Another aspect is that the overall package size and height may be reduced because there are fewer space limitations when a lead frame is not present.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the leadless integrated circuit packaging system of the present invention furnishes important and heretofore unknown and unavailable solutions, capabilities, and functional aspects for increasing the integration density of integrated circuit packages while continuing to shrink the package outline. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of a leadless integrated circuit packaging system comprising:
   providing a substrate;

patterning a die attach pad on the substrate;
forming a tiered plated pad array having plated pads around the die attach pad, the plated pads along a lateral direction away from the die attach pad having additional layers of a spacer metal for progressively increasing the height of the plated pads in a direction away from the die attach pad;
mounting an integrated circuit die on the die attach pad;
coupling an electrical interconnect between the integrated circuit die and the tiered plated pad array;
forming a molded package body on the integrated circuit die, the electrical interconnects, and the tiered plated pad array; and
exposing a contact pad layer by removing the substrate.

2. The method as claimed in claim 1 wherein forming the tiered plated pad array includes plating a one tier plated pad, a two tier plated pad, a three tier plated pad, or a combination thereof.

3. The method as claimed in claim 1 wherein coupling the electrical interconnect to the tiered plated pad array includes coupling a connection cap layer to the electrical interconnect.

4. The method as claimed in claim 1 wherein forming the tiered plated pad array includes forming a one tiered plated pad adjacent to the die attach pad.

5. The method as claimed in claim 1 wherein exposing the contact pad layer includes revealing a package contact surrounded by the molded package body.

6. A method of manufacture of a leadless integrated circuit packaging system comprising:
providing a substrate including having a planar surface on the substrate;
patterning a die attach pad on the substrate including applying a first mask layer on the planar surface;
forming a tiered plated pad array having plated pads around the die attach pad, the plated pads along a lateral direction away from the die attach pad having additional layers of a spacer metal for progressively increasing the height of the plated pads in a direction away from the die attach pad;
mounting an integrated circuit die on the die attach pad including applying an adhesive between the die attach pad and the integrated circuit die;
coupling an electrical interconnect between the integrated circuit die and the tiered plated pad array;
forming a molded package body on the integrated circuit die, the electrical interconnects, and the tiered plated pad array; and
exposing a contact pad layer by removing the substrate including providing a package contact in the molded package body.

7. The method as claimed in claim 6 wherein forming the tiered plated pad array includes plating a one tier plated pad, a two tier plated pad, a three tier plated pad, or a combination thereof including plating the spacer metal between the contact pad layer and a connection cap layer.

8. The method as claimed in claim 6 wherein coupling the electrical interconnect to the tiered plated pad array includes coupling a connection cap layer to the electrical interconnect including coupling a bond pad on the integrated circuit die.

9. The method as claimed in claim 6 wherein forming the tiered plated pad array includes forming a one tier plated pad adjacent to the die attach pad including forming a two tier plated pad between the one tier plated pad and a three tier plated pad.

10. The method as claimed in claim 6 wherein exposing the contact pad layer includes revealing a package contact surrounded by the molded package body including revealing a gold layer.

11. A leadless integrated circuit packaging system comprising:
a die attach pad;
a tiered plated pad array having plated pads around the die attach pad, the plated pads along a lateral direction away from the die attach pad having additional layers of a spacer metal for progressively increasing the height of the plated pads in a direction away from the die attach pad;
an integrated circuit die mounted on the die attach pad;
an electrical interconnect coupled to the tiered plated pad array and the integrated circuit die;
a molded package body on the integrated circuit die, the electrical interconnects, and the tiered plated pad array; and
a contact pad layer on a package bottom of the molded package body.

12. The system as claimed in claim 11 wherein the tiered plated pad array includes a one tier plated pad, a two tier plated pad, a three tier plated pad, or a combination thereof.

13. The system as claimed in claim 11 wherein the electrical interconnect coupled to the tiered plated pad array includes a connection cap layer coupled to the electrical interconnect.

14. The system as claimed in claim 11 wherein the tiered plated pad array includes a one tier plated pad adjacent to the die attach pad.

15. The system as claimed in claim 11 wherein the contact pad layer on the package bottom includes a package contact surrounded by the molded package body.

16. The system as claimed in claim 11 further comprising:
an adhesive between the die attach pad and the integrated circuit die; and
a package contact in the molded package body.

17. The system as claimed in claim 16 wherein the tiered plated pad array includes a one tier plated pad, a two tier plated pad, a three tier plated pad, or a combination thereof including the spacer metal between the contact pad layer and a connection cap layer.

18. The system as claimed in claim 16 wherein the electrical interconnect coupled to the tiered plated pad array includes a connection cap layer coupled to the electrical interconnect and a bond pad on the integrated circuit die.

19. The system as claimed in claim 16 wherein the tiered plated pad array includes a one tier plated pad adjacent to the die attach pad including a two tier plated pad between the one tier plated pad and a three tier plated pad.

20. The system as claimed in claim 16 wherein the contact pad layer includes the package contact surrounded by the molded package body includes a gold layer.

* * * * *